United States Patent
Takama

(10) Patent No.: US 11,266,050 B2
(45) Date of Patent: Mar. 1, 2022

(54) COMPONENT MOUNTING DEVICE

(71) Applicant: YAMAHA HATSUDOKI KABUSHIKI KAISHA, Iwata (JP)

(72) Inventor: Kazushi Takama, Iwata (JP)

(73) Assignee: YAMAHA HATSUDOKI KABUSHIKI KAISHA, Iwata (JP)

( * ) Notice: Subject to any disclaimer, the term of this patent is extended or adjusted under 35 U.S.C. 154(b) by 205 days.

(21) Appl. No.: 16/484,067

(22) PCT Filed: Feb. 7, 2017

(86) PCT No.: PCT/JP2017/004454
§ 371 (c)(1),
(2) Date: Aug. 6, 2019

(87) PCT Pub. No.: WO2018/146732
PCT Pub. Date: Aug. 16, 2018

(65) Prior Publication Data
US 2020/0008332 A1  Jan. 2, 2020

(51) Int. Cl.
*H05K 13/08* (2006.01)
*H05K 13/04* (2006.01)

(52) U.S. Cl.
CPC ..... *H05K 13/0812* (2018.08); *H05K 13/0409* (2018.08); *H05K 13/0413* (2013.01); *H05K 13/0417* (2013.01); *H05K 13/0452* (2013.01)

(58) Field of Classification Search
CPC ........... H05K 13/0409; H05K 13/0413; H05K 13/0417; H05K 13/0452; H05K 13/0812
See application file for complete search history.

(56) References Cited

U.S. PATENT DOCUMENTS

| | | | |
|---|---|---|---|
| 5,541,834 A * | 7/1996 | Tomigashi | H05K 13/0812 700/59 |
| 7,239,199 B1 * | 7/2007 | Chien | H03F 3/45085 330/259 |

(Continued)

FOREIGN PATENT DOCUMENTS

| | | | |
|---|---|---|---|
| CN | 101902902 A | * | 12/2010 |
| CN | 103108114 A | | 5/2013 |

(Continued)

OTHER PUBLICATIONS

International Search Report issued in PCT/JP2017/004454; dated May 16, 2017.

(Continued)

*Primary Examiner* — Carl J Arbes
(74) *Attorney, Agent, or Firm* — Studebaker & Brackett PC

(57) ABSTRACT

A component mounting device includes a head unit including a mounting head configured to mount a component on a substrate, a component feeder configured to feed the component to the mounting head, and an imager provided on the head unit and configured to be able to image a component feeding location of the component feeder from a plurality of directions. The component mounting device further includes a controller configured to acquire a horizontal position and a vertical height position of the component at the component feeding location based on images of the component feeding location captured from the plurality of directions by the imager.

20 Claims, 5 Drawing Sheets

(56) References Cited

U.S. PATENT DOCUMENTS

| | | | | |
|---|---|---|---|---|
| 8,595,918 | B2 * | 12/2013 | Jindo | H04N 5/2355 29/709 |
| 9,036,022 | B2 * | 5/2015 | Tsuboi | H05K 13/0413 348/86 |
| 9,265,186 | B2 * | 2/2016 | Nguyen | H05K 13/0413 |
| 10,420,267 | B2 * | 9/2019 | Kanai | H05K 13/0408 |
| 10,888,041 | B2 * | 1/2021 | Takama | H05K 13/0465 |
| 10,912,241 | B2 * | 2/2021 | Takama | H05K 13/0413 |
| 2001/0055069 | A1 * | 12/2001 | Hudson | H05K 13/0812 348/302 |
| 2003/0123755 | A1 * | 7/2003 | Shimizu | G06T 7/73 382/291 |
| 2006/0096086 | A1 | 5/2006 | Coots et al. | |

FOREIGN PATENT DOCUMENTS

| | | | |
|---|---|---|---|
| CN | 103609209 | A | 2/2014 |
| CN | 104105391 | A | 10/2014 |
| CN | 104540648 | A | 4/2015 |
| CN | 105075419 | A | 11/2015 |
| CN | 105309064 | A | 2/2016 |
| JP | H05-198999 | A | 8/1993 |
| JP | H11-204992 | A | 7/1999 |
| JP | 3339213 | B2 * | 10/2002 |
| JP | 3691888 | B2 | 9/2005 |
| JP | 2005-537630 | A | 12/2005 |
| JP | 2011-066041 | A | 3/2011 |
| JP | 2012-033829 | A | 2/2012 |
| JP | 2012-248626 | A | 12/2012 |
| JP | 2014-216621 | A | 11/2014 |
| JP | 2015-070176 | A | 4/2015 |
| JP | 2015-230912 | A | 12/2015 |
| JP | 2016-171234 | A | 9/2016 |
| WO | 03/043400 | A1 * | 5/2003 |
| WO | 2016/203638 | | * 12/2016 |
| WO | 2016/203639 | A1 | 12/2016 |

OTHER PUBLICATIONS

Written Opinion issued in PCT/JP2017/004454; dated May 16, 2017.

An Office Action; "Notice of Reasons for Refusal," mailed by the Japanese Patent Office dated Sep. 1, 2020, which corresponds to Japanese Patent Application No. 2018-566677 and is related to U.S. Appl. No. 16/484,067; with English language translation.

An Office Action mailed by the State Intellectual Property Office of the People's Republic of China dated Apr. 15, 2020, which corresponds to Chinese Patent Application No. 201780084490.X and is related to U.S. Appl. No. 16/484,067.

An Office Action; "Decision of Refusal," mailed by the Japanese Patent Office dated Jan. 12, 2021, which corresponds to Japanese Patent Application No. 2018-566677 and is related to U.S. Appl. No. 16/484,067 with English language translation.

An Office Action; "Notice of Reasons for Refusal," mailed by the Japanese Patent Office dated Sep. 21, 2021, which corresponds to Japanese Patent Application No. 2020-178383 and is related to U.S. Appl. No. 16/484,067; with English language translation.

* cited by examiner

DURING SUCTION OF COMPONENT

MEASUREMENT OF COMPONENT FEEDING LOCATION

COMPONENT MOUNTING DEVICE

CROSS-REFERENCE TO RELATED APPLICATION

This application is a National Stage of International Patent Application No. PCT/JP2017/004454, filed Feb. 7, 2017, the entire content of which is incorporated herein by reference.

BACKGROUND

Technical Field

The present disclosure relates to a component mounting device.

Background Art

In general, a component mounting device is known. Such a component mounting device is disclosed in Japanese Patent No. 3691888, for example.

Japanese Patent No. 3691888 described above discloses an electronic component mounting device (component mounting device) including a suction head configured to mount components on a substrate, a feeder configured to feed the components to the suction head, a camera configured to image a component feeding location of the feeder from above, and an optical distance sensor configured to measure the height position of the component feeding location of the feeder. In this electronic component mounting device, the height position of the component feeding location is measured by the optical distance sensor, and the horizontal position of the component feeding location is measured by imaging of the camera.

SUMMARY

In the electronic component mounting device disclosed in Japanese Patent No. 3691888 described above, the height position of the component feeding location is measured by the optical distance sensor, the optical distance sensor is moved to a position different from a position at which the height is measured, and the horizontal position of the component feeding location is measured by camera imaging. Thus, movement of a measurement position is required, and thus there is a problem that the time of the component suction operation increases.

The present disclosure thus provides a component mounting device capable of significantly reducing or preventing an increase in the time of the component suction operation due to movement of a measurement position for measuring the height position and the horizontal position of a component at a component feeding position.

A component mounting device according to an aspect of the present disclosure includes a head unit including a mounting head configured to mount a component on a substrate, a component feeder configured to feed the component to the mounting head, and an imager provided on the head unit and configured to be able to image a component feeding location of the component feeder from a plurality of directions. The component mounting device further includes a controller configured to acquire a horizontal position and a vertical height position of the component at the component feeding location based on images of the component feeding location captured from the plurality of directions by the imager.

In the component mounting device according to this aspect of the present disclosure, as described above, the component mounting device includes the controller configured to acquire the horizontal position and the vertical height position of the component at the component feeding location based on the images of the component feeding location captured from the plurality of directions by the imager. Accordingly, imaging can be performed without moving the head unit in a horizontal direction in order to acquire the height position and the horizontal position of the component feeding location, and thus an increase in the time required to image the component feeding location can be significantly reduced or prevented. Thus, an increase in the time of the component suction operation due to movement of a measurement position for measuring the height position and the horizontal position of the component at the component feeding location can be significantly reduced or prevented. Furthermore, the horizontal position and the vertical height position of the component at the component feeding location can be acquired based on the common imaging results, and thus an increase in the time of the component suction operation can be significantly reduced or prevented as compared with the case in which the height position and the horizontal position of the component feeding location are separately measured.

In the aforementioned component mounting device according to this aspect, the controller is preferably configured to correct and acquire the horizontal position of the component based on the vertical height position of the component at the component feeding location. According to this structure, when the component feeding location is imaged from oblique directions, the horizontal position can be corrected and acquired even though the vertical height position of the component at the component feeding location is deviated from a reference position. Thus, the horizontal position of the component can be accurately acquired.

In the aforementioned component mounting device according to this aspect, the controller is preferably configured to acquire a height around the component feeding location based on the images of the component feeding location captured from the plurality of directions by the imager, and to determine a presence or absence of a component to be suctioned at the component feeding location. According to this structure, the presence or absence of the component can be determined based on the height around the component feeding location, and thus the presence or absence of the component can be determined without depending on imaging conditions such as luminance unlike the case in which image analysis is performed using an image density threshold or the like to determine the presence or absence of the component. Consequently, the presence or absence of the component can be accurately determined. Furthermore, the presence or absence of the component at the component feeding location is determined such that when the component is absent, it is possible to recognize that the component cannot be suctioned before performing imaging for confirming the position and orientation of the component that has been suctioned, and thus the time required to suction the component can be reduced. Thus, an increase in the time of the component suction operation can be effectively significantly reduced or prevented. Such an effect is particularly useful for suctioning a component so small that it is difficult to determine whether or not the component has been suctioned due to a change in the negative pressure of air for the component suction of the mounting head.

In this case, the controller is preferably configured to perform control of feeding a new component to the component feeding location when the component to be suctioned is absent at the component feeding location, and to control the mounting head to suction the component again. According to this structure, even when the component is absent at the component feeding location such that component suction cannot be performed, the suction operation can be performed again before the mounting head is moved in the horizontal direction, and thus the time loss corresponding to the time required to move the mounting head in the horizontal direction can be effectively significantly reduced or prevented.

In the aforementioned component mounting device according to this aspect, the controller is preferably configured to acquire the vertical height position of the component at the component feeding location during an operation of suctioning the component by the mounting head based on the images of the component feeding location captured from the plurality of directions by the imager, and to perform control of correcting a suction height position in a vertical direction and suctioning the component. According to this structure, as compared with the case in which a distance sensor or the like is disposed above the component feeding location and measures the height position of the component at the component feeding location, and thereafter the mounting head is moved above the component feeding location and suctions the component, the time loss corresponding to the time required to move the mounting head in the horizontal direction can be significantly reduced or prevented, and thus an increase in the time of the component suction operation can be effectively significantly reduced or prevented.

In the aforementioned component mounting device according to this aspect, the controller is preferably configured to control the imager to image the component feeding location from the plurality of directions when the mounting head is lowered to the component feeding location. According to this structure, imaging can be concurrently performed when the mounting head is lowered to suction the component, and thus the time of the component suction operation can be reduced as compared with the case in which imaging and lowering of the mounting head are separately performed.

In the aforementioned component mounting device according to this aspect, the imager is preferably configured to be able to image the component feeding location from a plurality of oblique directions with respect to a vertical direction. According to this structure, in a state in which the mounting head is disposed above the component feeding location, the component feeding location can be imaged by the imager, and thus the component suction operation of the mounting head and the imaging operation can be easily performed concurrently. Thus, an increase in the time of the component suction operation can be effectively significantly reduced or prevented.

In the aforementioned component mounting device according to this aspect, the imager preferably includes a plurality of cameras, or a single camera and an optical system configured to divide a field of view of the single camera. According to this structure, the component feeding location can be easily imaged from the plurality of directions by the plurality of cameras, or the optical system configured to divide the field of view of the single camera.

According to the present disclosure, as described above, it is possible to provide the component mounting device capable of significantly reducing or preventing an increase in the time of the component suction operation due to movement of a measurement position for measuring the height position and the horizontal position of the component at the component feeding location.

DETAILED DESCRIPTION

An embodiment embodying the present disclosure is hereinafter described on the basis of the drawings.

(Structure of Component Mounting Device)

The structure of a component mounting device 100 according to the embodiment of the present disclosure is now described with reference to FIG. 1.

Figure 1:
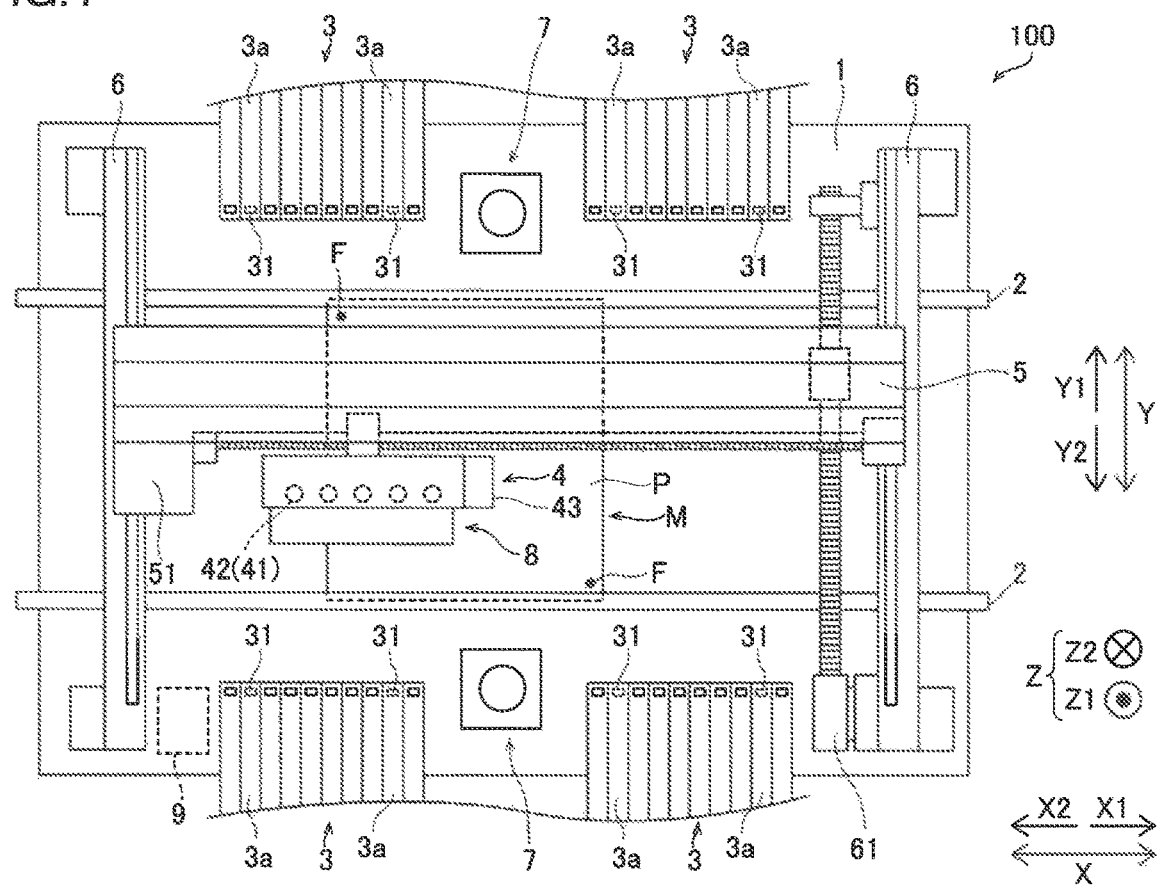
FIG. 1 is a diagram showing the overall structure of a component mounting device according to an embodiment of the present disclosure.

As shown in FIG. 1, the component mounting device 100 is a component mounting device configured to convey a substrate P in an X direction by a pair of conveyors 2 and to mount components 31 on the substrate P at a mounting operation position M.

The component mounting device 100 includes a base 1, the pair of conveyors 2, component feeders 3, a head unit 4, a support 5, a pair of rails 6, component recognition imagers 7, an imaging unit 8, and a controller 9. The imaging unit 8 is an example of an "imager" in the claims.

The pair of conveyors 2 are installed on the base 1 and are configured to convey the substrate P in the X direction. In addition, the pair of conveyors 2 include a holding mechanism that holds the substrate P being conveyed in a stopped state at the mounting operation position M. Moreover, an interval between the pair of conveyors 2 in a Y direction can be adjusted according to the dimensions of the substrate P.

The component feeders 3 are disposed outside (Y1 and Y2 sides) of the pair of conveyors 2. A plurality of tape feeders 3a are disposed in the component feeders 3. The component feeders 3 are configured to feed the components 31 to mounting heads 42 described below.

The tape feeders 3a hold reels (not shown) on which tapes that hold a plurality of components 31 at a predetermined interval are wound. The tape feeders 3a feed the components 31 from the tips of the tape feeders 3a by rotating the reels to feed the tapes that hold the components 31. The components 31 include electronic components such as ICs, transistors, capacitors, and resistors.

The head unit 4 is disposed above the pair of conveyors 2 and the component feeders 3, and includes a plurality of (five) mounting heads 42 including nozzles 41 (see FIG. 2) attached to their lower ends and a substrate recognition camera 43.

The mounting heads 42 are configured to mount the components 31 on the substrate P. Specifically, the mounting heads 42 are configured to suction the components 31 supplied by the component feeders 3 and to mount the suctioned components 31 on the substrate P disposed at the mounting operation position M. The mounting heads 42 are movable up and down (movable in a Z direction), and are configured to suction and hold the components 31 fed from the tape feeders 3a by a negative pressure generated at the tips of the nozzles 41 by a negative pressure generator (not shown) and to mount the components 31 at mounting positions on the substrate P.

The substrate recognition camera 43 is configured to image fiducial marks F of the substrate P in order to recognize the position and the orientation of the substrate P. The positions of the fiducial marks F are imaged and recognized such that the mounting positions of the components 31 on the substrate P can be accurately acquired.

The support 5 includes a motor 51. The support 5 is configured to move the head unit 4 in the X direction along the support 5 by driving the motor 51. Opposite ends of the support 5 are supported by the pair of rails 6.

The pair of rails 6 are fixed on the base 1. A rail 6 on the X1 side includes a motor 61. The rails 6 are configured to move the support 5 in the Y direction orthogonal to the X direction along the pair of rails 6 by driving the motor 61. The head unit 4 is movable in the X direction along the support 5, and the support 5 is movable in the Y direction along the rails 6 such that the head unit 4 is movable in a horizontal direction (XY direction).

The component recognition imagers 7 are fixed on the upper surface of the base 1. The component recognition imagers 7 are disposed outside (Y1 and Y2 sides) of the pair of conveyors 2. The component recognition imagers 7 are configured to image the components 31 suctioned by the nozzles 41 of the mounting heads 42 from below (Z2 side) in order to recognize the suction states (suction orientations) of the components 31 prior to mounting of the components 31. Thus, the suction states of the components 31 suctioned by the nozzles 41 of the mounting heads 42 can be acquired by the controller 9.

Figure 2:
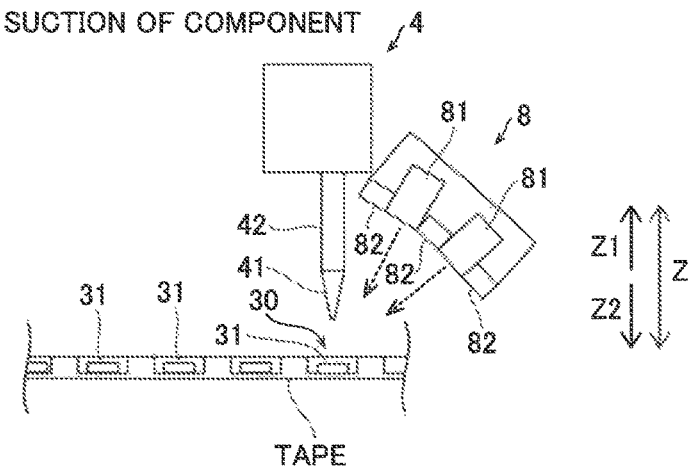
FIG. 2 is a side view of a head unit of the component mounting device according to the embodiment of the present disclosure during suction of a component.

The imaging unit 8 is provided on the head unit 4. Thus, the imaging unit 8 is configured to move in the horizontal direction (XY direction) together with the head unit 4 as the head unit 4 moves in the XY direction. Furthermore, the imaging unit 8 is configured to be able to image the component feeding location 30 (see FIG. 2) of each of the component feeders 3 from a plurality of directions. In addition, the imaging unit 8 is configured to be able to capture images for measuring the height of the mounting position of the substrate P. As shown in FIG. 2, the imaging unit 8 includes a plurality of cameras 81 and illuminators 82. Thus, the imaging unit 8 can image the component feeding location 30 of each of the component feeders 3 and an area around the component feeding location 30 from the plurality of directions (angles).

Figure 3:
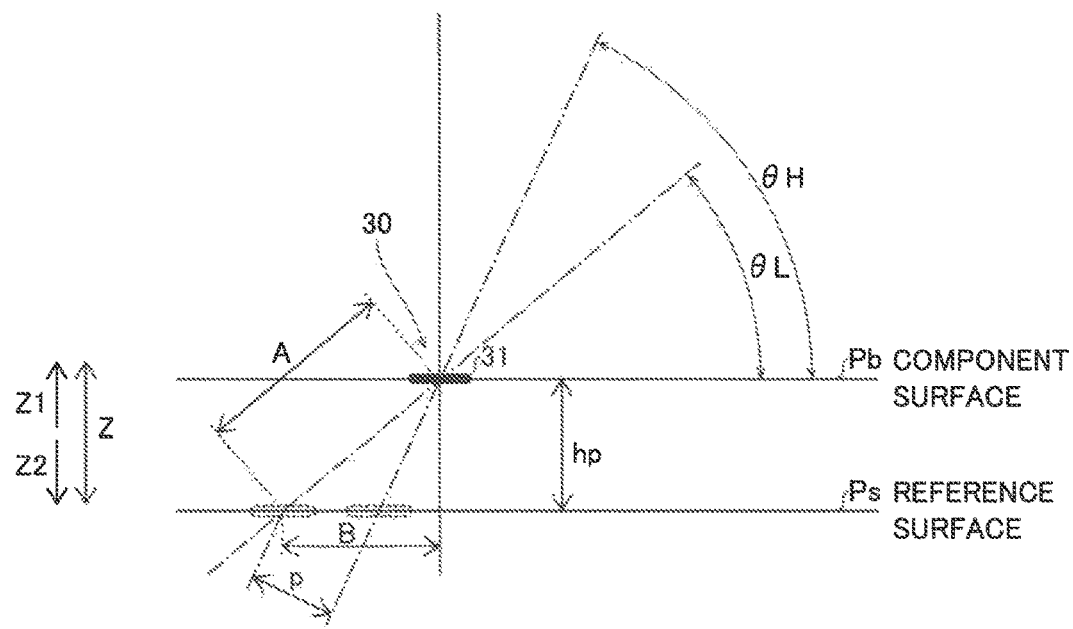
FIG. 3 is a diagram illustrating measurement of the position of the component at a component feeding location in the component mounting device according to the embodiment of the present disclosure.

As shown in FIG. 2, the imaging unit 8 is configured to be able to image the component feeding location 30 from a plurality of oblique directions with respect to a vertical direction (Z direction). Specifically, as shown in FIG. 3, the imaging unit 8 is configured to perform imaging from inclination angles ($\theta H$ and $\theta L$) at which imaging directions are different from each other with respect to a component surface Pb. Furthermore, the cameras 81 of the imaging unit 8 are disposed adjacent to each other in a vertical plane (in a Y-Z plane) including the component feeding location 30 with respect to the component surface Pb. In addition, the plurality of cameras 81 are disposed vertically offset.

The illuminators 82 are configured to emit light when the cameras 81 capture images. The illuminators 82 are provided around the cameras 81. The illuminators 82 each include a light source such as an LED (light-emitting diode).

The controller 9 includes a CPU, and is configured to control the overall operation of the component mounting device 100 such as the substrate P conveying operation performed by the pair of conveyors 2, the mounting operation performed by the head unit 4, and the imaging operations performed by the component recognition imagers 7, the imaging unit 8, and the substrate recognition camera 43.

According to this embodiment, the controller 9 is configured to acquire the horizontal (XY direction) position and the vertical height position (Z direction) of a component 31 at the component feeding location 30 based on the images of the component feeding location 30 captured from the plurality of directions by the imaging unit 8. Furthermore, the controller 9 is configured to correct and acquire the horizontal (XY direction) position of the component 31 based on the vertical (Z direction) height position of the component 31 at the component feeding location 30.

Specifically, as shown in FIG. 3, the controller 9 is configured to acquire the height position of the component surface Pb with respect to a reference surface Ps through stereo matching. That is, the height position and the horizontal position of the component 31 are acquired by matching the images of the component feeding location 30 substantially simultaneously captured by the plurality of cameras 81. As the matching, a general matching method such as a sum of squared difference (SSD) or a sum of absolute difference (SAD) is used.

More specifically, a target component 31 is imaged at the inclination angle $\theta H$ by one camera 81, and is imaged at the inclination angle $\theta L$ by the other camera 81. That is, the target component 31 is substantially simultaneously imaged by the plurality of cameras 81. Then, stereo matching between the captured image at the inclination angle $\theta H$ and the captured image at the inclination angle $\theta L$ is performed such that a parallax p (pixel) between the two captured images is obtained. Assuming that the camera resolution of the cameras 81 is R (µm/pixel), a distance A (µm) is obtained from an expression (1).

$$A = p \times R / \sin(\theta H - \theta L) \tag{1}$$

Then, the height position hp (µm) of the component surface Pb with respect to the reference surface Ps is obtained from an expression (2) using the distance A obtained from the expression (1).

$$hp = A \times \sin(\theta L) \tag{2}$$

Furthermore, a distance B (µm) shifted with respect to the horizontal position when the component 31 exists on the reference surface Ps is obtained by an expression (3) using the distance A obtained by the expression (1).

$$B = A \times \cos(\theta L) \tag{3}$$

Thus, the vertical height position and the horizontal position of the component 31 at the component feeding location 30 are accurately obtained. Note that an angular error occurs due to deviation from the center of the field of view of the camera 81 depending on the height position and the position of the target component 31. The angular error is corrected by a previously obtained table or calculation, for example.

The controller 9 is configured to acquire the height around the component feeding location 30 based on the images of the component feeding location 30 captured from the plurality of directions by the imaging unit 8, and to determine the presence or absence of the component 31 at the component feeding location 30. The controller 9 is also configured to perform control of feeding a new component 31 to the component feeding location 30 when the component 31 to be suctioned is absent at the component feeding location 30, and to control the mounting head 42 to suction the component 31 again. Specifically, the controller 9 controls a tape feeder 3a to feed a tape and feeds a new component 31 to the component feeding location 30. In a state in which a new component 31 has been fed to the component feeding location 30, the controller 9 controls the mounting head 42 to suction the component 31 again.

Figure 4:
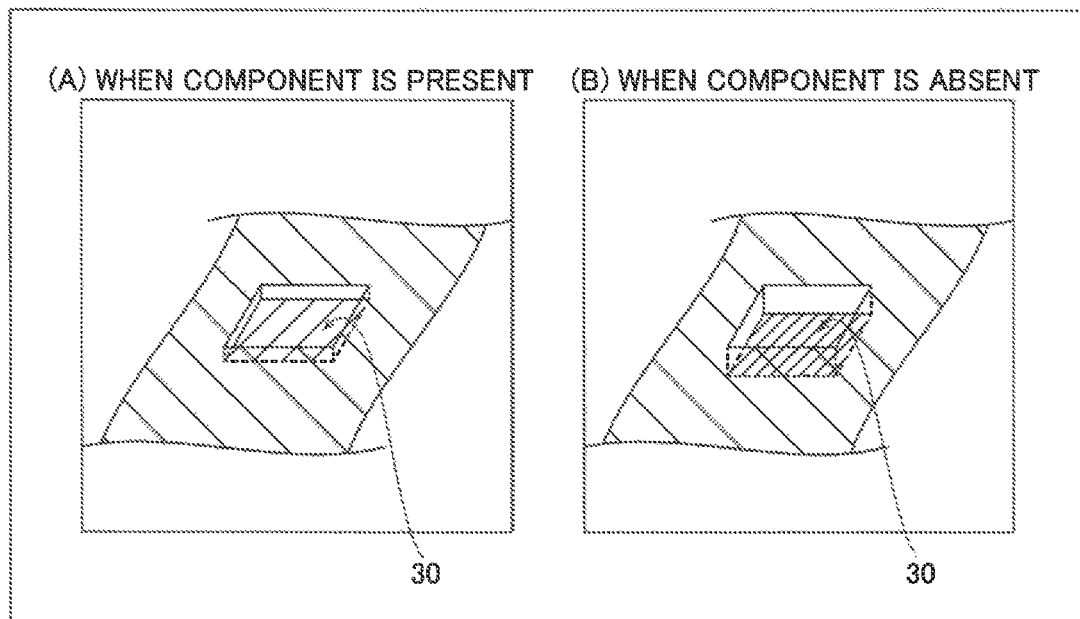
FIG. 4 is a diagram showing an example of information about the height of the component feeding location in the component mounting device according to the embodiment of the present disclosure.

As shown in an example of FIG. 4, when the component 31 is at the component feeding location 30 (a pocket of the tape), as shown in (A), a height difference between the position of a portion (the upper surface of the tape) outside the component feeding location 30 and the position of the component feeding location 30 is smaller. On the other hand, when the component 31 is not at the component feeding location 30 (a pocket of the tape), as shown in (B), the height difference between the position of the portion (the upper surface of the tape) outside the component feeding location 30 and the position of the component feeding location 30 is larger. When the height difference is more than a predetermined threshold, for example, the controller 9 determines that the component 31 is not at component feeding location 30, and when the height difference is not more than the predetermined threshold, the controller 9 determines that the component 31 is at the component feeding location 30. In this case, the predetermined threshold is determined for each type of component 31 based on the size, the thickness in the height direction, etc. of the component 31. The predetermined threshold may be stored in a table, or may be determined by calculation based on the information about the component 31.

The controller 9 is configured to acquire the vertical (Z direction) height position of the component 31 at the component feeding location 30 during the operation of suctioning the component 31 by the mounting head 42 based on the images of the component feeding location 30 captured from the plurality of directions by the imaging unit 8, and to perform control of correcting the suction height position in the vertical direction and suctioning the component 31. Furthermore, the controller 9 is configured to control the imaging unit 8 to image the component feeding location 30 from the plurality of directions when the mounting head 42 is lowered to the component feeding location 30.

(Control Processing at Time of Suction Operation)

Figure 5:
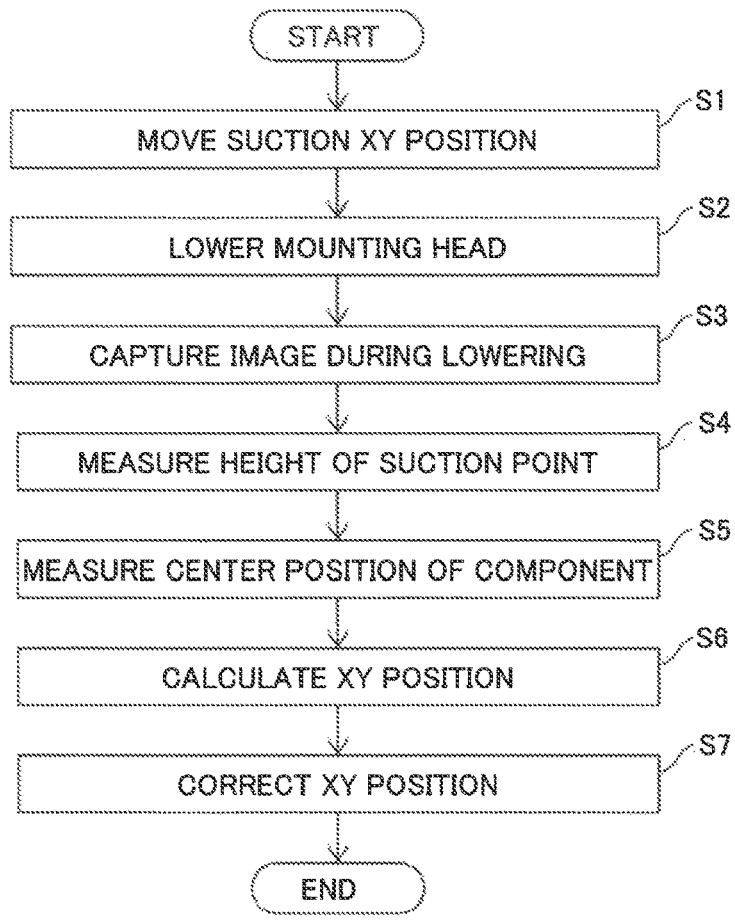
FIG. 5 is a flowchart illustrating control processing (first operation example) during the suction operation in the component mounting device according to the embodiment of the present disclosure.
Figure 6:
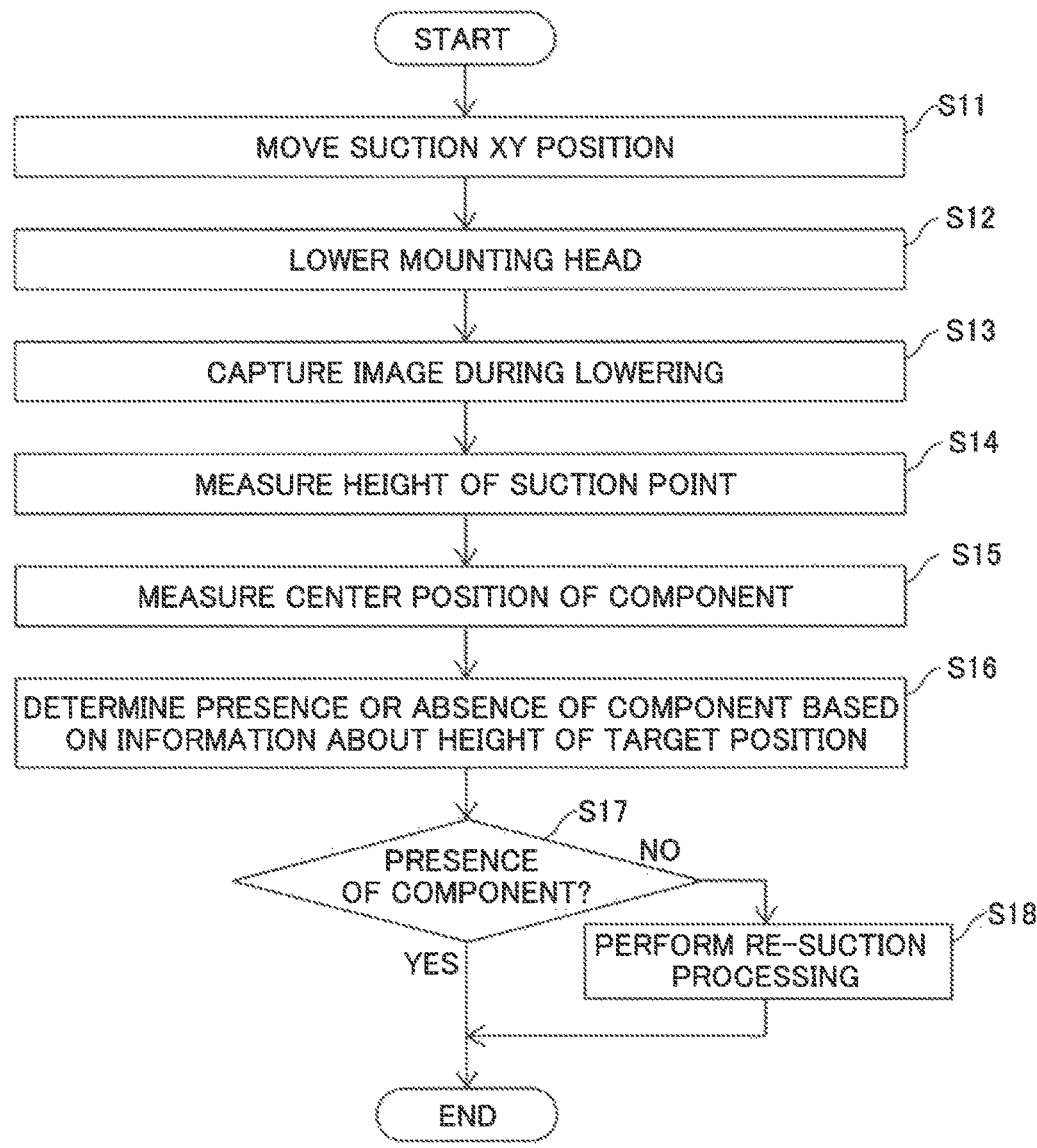
FIG. 6 is a flowchart illustrating control processing (second operation example) during the suction operation in the component mounting device according to the embodiment of the present disclosure.
Figure 7:
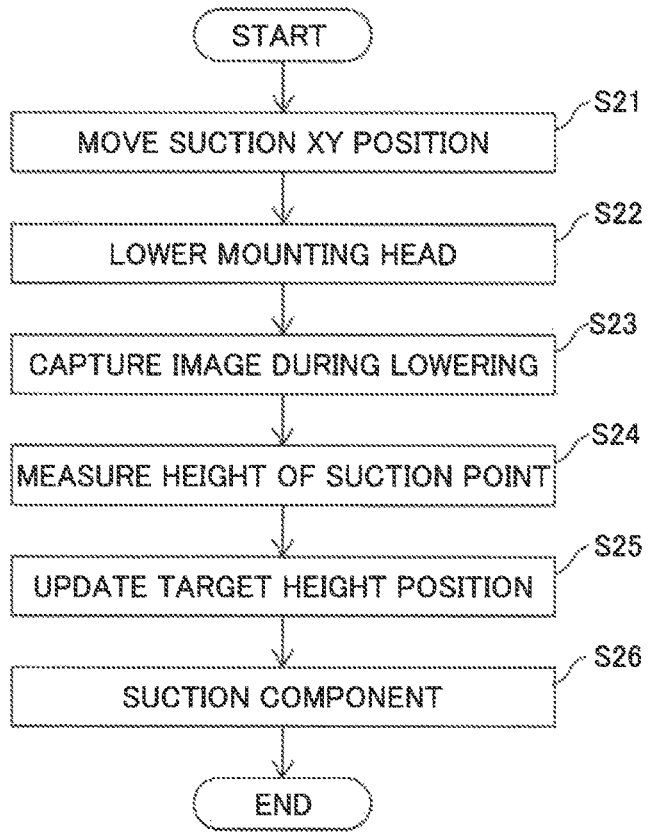
FIG. 7 is a flowchart illustrating control processing (third operation example) during the suction operation in the component mounting device according to the embodiment of the present disclosure.

Control processing during the component suction operation by the controller 9 of the component mounting device 100 is now described based on flowcharts with reference to FIGS. 5 to 7.

First, a first operation example is described with reference to FIG. 5. In step S1 of FIG. 5, the mounting head 42 (nozzle 41) is moved to a suction XY position. That is, the mounting head 42 is moved in the horizontal direction so as to be positioned above the component feeding location 30.

In step S2, the mounting head 42 (nozzle 41) is lowered toward the component feeding location 30. In step S3, the component feeding location 30 is imaged by the imaging unit 8 while the mounting head 42 (nozzle 41) is lowered. That is, the images of the component 31 immediately before suction at the component feeding location 30 are captured.

In step S4, the height of the suction point is measured. Specifically, the vertical (Z direction) height position of the component 31 at the component feeding location 30 is measured based on the images of the component feeding location 30 captured from the plurality of directions by the imaging unit 8.

In step S5, the center position of the component 31 is measured. Specifically, the center position of the component 31 at the component feeding location 30 is measured based on the images of the component feeding location 30 captured by the imaging unit 8. In the case of a rectangular component, the center position of the component 31 is an intersection of diagonal lines, for example. In addition, the center position of the component 31 is the geometrical center of gravity of the component 31, for example.

In step S6, the XY position (horizontal position) of the component 31 is calculated. Specifically, the XY position of the component 31 is calculated based on the images of the component feeding location 30 captured by the imaging unit 8 and the height position of the component 31 measured in step S4. In step S7, the XY position of the component 31 at the component feeding location 30 recognized by the controller 9 is corrected. Then, the component 31 is suctioned by the mounting head 42 (nozzle 41), and thereafter the control processing during the suction operation is terminated. The control processing during the suction operation is performed for each operation of suctioning the component 31 by the mounting head 42 (nozzle 41).

Next, a second operation example is described with reference to FIG. 6. In step S11 of FIG. 6, the mounting head 42 (nozzle 41) is moved to the suction XY position. That is, the mounting head 42 is moved in the horizontal direction so as to be positioned above the component feeding location 30.

In step S12, the mounting head 42 (nozzle 41) is lowered toward the component feeding location 30. In step S13, the component feeding location 30 is imaged by the imaging unit 8 while the mounting head 42 (nozzle 41) is lowered. That is, the images of the component 31 immediately before suction at the component feeding location 30 are captured.

In step S14, the height of the suction point is measured. Specifically, the vertical (Z direction) height position of the component 31 at the component feeding location 30 is measured based on the images of the component feeding location 30 captured from the plurality of directions by the imaging unit 8.

In step S15, the center position of the component 31 is measured. Specifically, the center position of the component 31 at the component feeding location 30 is measured based on the images of the component feeding location 30 captured by the imaging unit 8.

In step S16, the presence or absence of the component 31 is determined based on information about the height of the target position. Specifically, the height around the component feeding location 30 is acquired based on the images of the component feeding location 30 captured from the plurality of directions by the imaging unit 8. Then, the presence or absence of the component 31 to be suctioned at the component feeding location 30 is determined based on the acquired information about the height around the component feeding location 30.

In step S17, it is determined whether or not the component 31 is at the component feeding location 30. When the component 31 is at the component feeding location 30, the component 31 is suctioned by the mounting head 42 (nozzle 41), and thereafter the control processing during the suction operation is terminated. When the component 31 is not at the component feeding location 30, the processing advances to step S18. In step S18, re-suction processing is performed. Specifically, a new component 31 is fed to the component feeding location 30, and the mounting head 42 suctions the component 31 again. Thereafter, the control processing during the suction operation is terminated.

Next, a third operation example is described with reference to FIG. 7. In step S21 of FIG. 7, the mounting head 42 (nozzle 41) is moved to the suction XY position. That is, the mounting head 42 is moved in the horizontal direction so as to be positioned above the component feeding location 30.

In step S22, the mounting head 42 (nozzle 41) is lowered toward the component feeding location 30. In step S23, the component feeding location 30 is imaged by the imaging unit 8 while the mounting head 42 (nozzle 41) is lowered. That is, the images of the component 31 immediately before suction at the component feeding location 30 are captured.

In step S24, the height of the suction point is measured. Specifically, the vertical (Z direction) height position of the component 31 at the component feeding location 30 is measured based on the images of the component feeding location 30 captured from the plurality of directions by the imaging unit 8.

In step S25, the target height position is updated. Specifically, the vertical (Z direction) height position of the component 31 at the component feeding location 30 recognized by the controller 9 is updated. In this case, information about the updated height position is used for immediately subsequent suction of the component 31, for example. In addition, the information about the updated height position is measured for each suction, is calculated by a simple average or a moving average, and is used for the next and subsequent suctions, for example.

In step S26, the component 31 is suctioned by the mounting head 42 (nozzle 41). Thereafter, the control processing during the suction operation is terminated. The measurement of the height position of the component 31 may be performed for each suction or may be performed periodically.

Effects of Embodiment

According to the present embodiment, the following effects can be obtained.

According to the present embodiment, as described above, the component mounting device 100 includes the controller 9 configured to acquire the horizontal (XY direction) position and the vertical (Z direction) height position of the component 31 at the component feeding location 30 based on the images of the component feeding location 30 captured from the plurality of directions by the imaging unit 8. Accordingly, imaging can be performed without moving the head unit 4 in the horizontal direction in order to acquire the height position and the horizontal position of the component feeding location 30, and thus an increase in the time required to image the component feeding location 30 can be significantly reduced or prevented. Thus, an increase in the time of the component suction operation due to movement of a measurement position for measuring the height position and the horizontal position of the component 31 at the component feeding location 30 can be significantly reduced or prevented. Furthermore, the horizontal position and the vertical height position of the component 31 at the component feeding location 30 can be acquired based on the common imaging results, and thus an increase in the time of the component suction operation can be significantly reduced or prevented as compared with the case in which the height position and the horizontal position of the component feeding location 30 are separately measured.

According to the present embodiment, as described above, the controller 9 is configured to correct and acquire the horizontal (XY direction) position of the component 31 based on the vertical (Z direction) height position of the component 31 at the component feeding location 30. Accordingly, when the component feeding location 30 is imaged from oblique directions, the horizontal position can be corrected and acquired even though the vertical height position of the component 31 at the component feeding location 30 is deviated from a reference position. Thus, the horizontal position of the component 31 can be accurately acquired.

According to the present embodiment, as described above, the controller 9 is configured to acquire the height around the component feeding location 30 based on the images of the component feeding location 30 captured from the plurality of directions by the imaging unit 8, and to determine the presence or absence of the component 31 to be suctioned at the component feeding location 30. Accordingly, the presence or absence of the component 31 can be determined based on the height around the component feeding location 30, and thus the presence or absence of the component 31 can be determined without depending on imaging conditions such as luminance unlike the case in which image analysis is performed using an image density threshold or the like to determine the presence or absence of the component 31. Consequently, the presence or absence of the component 31 can be accurately determined. Furthermore, the presence or absence of the component 31 at the component feeding location 30 is determined such that when the component 31 is absent, it is possible to recognize that the component 31 cannot be suctioned before performing imaging for confirming the position and orientation of the component 31 that has been suctioned, and thus the time required to suction the component 31 can be reduced. Thus, an increase in the time of the component suction operation can be effectively significantly reduced or prevented. Such an effect is particularly useful for suctioning a component so small that it is difficult to determine whether or not the component 31 has been suctioned due to a change in the negative pressure of air for the component suction of the mounting head 42.

According to the present embodiment, as described above, the controller 9 is configured to perform control of feeding a new component 31 to the component feeding location 30 when the component 31 to be suctioned is absent at the component feeding location 30, and to control the mounting head 42 to suction the component 31 again. Accordingly, even when the component 31 is absent at the component feeding location 30 such that component suction cannot be performed, the suction operation can be performed again before the mounting head 42 is moved in the horizontal direction, and thus the time loss corresponding to the time required to move the mounting head 42 in the horizontal direction can be effectively significantly reduced or prevented.

According to the present embodiment, as described above, the controller 9 is configured to acquire the vertical (Z direction) height position of the component 31 at the component feeding location 30 during the operation of suctioning the component 31 by the mounting head 42 based on the images of the component feeding location 30 captured from the plurality of directions by the imaging unit 8, and to perform control of correcting the suction height position in the vertical direction and suctioning the component 31. Accordingly, as compared with the case in which a distance sensor or the like is disposed above the component feeding location 30 and measures the height position of the component 31 at the component feeding location 30, and thereafter the mounting head 42 is moved above the component feeding location 30 and suctions the component 31, the time loss corresponding to the time required to move the mounting head 42 in the horizontal direction (XY direction) can be significantly reduced or prevented, and thus an increase in the time of the component suction operation can be effectively significantly reduced or prevented.

According to the present embodiment, as described above, the controller 9 is configured to control the imaging unit 8 to image the component feeding location 30 from the plurality of directions when the mounting head 42 is lowered to the component feeding location 30. Accordingly, imaging can be concurrently performed when the mounting head 42 is lowered to suction the component 31, and thus the time of the component suction operation can be reduced as compared with the case in which imaging and lowering of the mounting head 42 are separately performed.

According to the present embodiment, as described above, the imaging unit 8 is configured to be able to image the component feeding location 30 from the plurality of oblique directions with respect to the vertical direction (Z direction). Accordingly, in a state in which the mounting head 42 is disposed above the component feeding location 30, the component feeding location 30 can be imaged by the imaging unit 8, and thus the component suction operation of the mounting head 42 and the imaging operation can be easily performed concurrently. Thus, an increase in the time of the component suction operation can be effectively significantly reduced or prevented.

According to the present embodiment, as described above, the imaging unit 8 includes the plurality of cameras 81. Accordingly, the component feeding location 30 can be easily imaged from the plurality of directions by the plurality of cameras 81.

Modified Examples

The embodiment disclosed this time must be considered as illustrative in all points and not restrictive. The scope of the present disclosure is not shown by the above description of the embodiment but by the scope of claims for patent, and all modifications (modified examples) within the meaning and range equivalent to the scope of claims for patent are further included.

Figure 8:
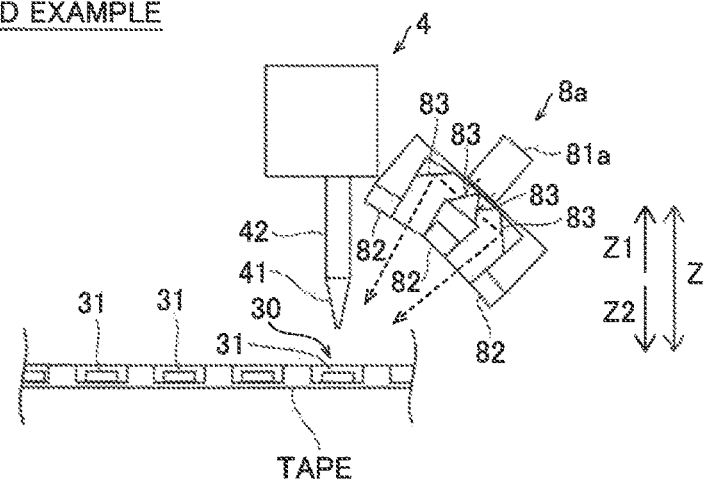
FIG. 8 is a side view of a head unit of a component mounting device according to a modified example of the embodiment of the present disclosure.

For example, while the example in which the imaging unit includes the plurality of cameras, and the component feeding location can be imaged from the plurality of directions has been shown in the aforementioned embodiment, the present disclosure is not restricted to this. According to the present disclosure, as in a modified example shown in FIG. 8, an imaging unit 8*a* may include a camera 81*a*, illuminators 82, and optical systems 83. In this case, the field of view of the single camera 81*a* may be divided by the optical systems 83 including lenses and mirrors, and a component feeding location may be imaged from a plurality of directions. The imaging unit 8*a* is an example of an "imager" in the claims.

Alternatively, the component feeding location may be imaged from a plurality of directions by performing imaging while moving one camera.

While the example in which the horizontal position and the vertical height position of the component are acquired by matching and analyzing the images of the component feeding location captured from the plurality of directions has been shown in the aforementioned embodiment, the present disclosure is not restricted to this. According to the present disclosure, the horizontal position and the vertical height position of the component may be acquired by analyzing the images of the component feeding location captured from the plurality of directions by analysis other than matching.

While the example in which the imager is configured to image the component feeding location while the mounting head is lowered has been shown in the aforementioned embodiment, the present disclosure is not restricted to this. According to the present disclosure, the imager may image the component feeding location before the mounting head is lowered.

While the example in which the horizontal position of the component feeding location is acquired during the operation of suctioning the component by the mounting head, and the suction position in the horizontal direction is corrected next time or later has been shown in the aforementioned embodiment, the present disclosure is not restricted to this. According to the present disclosure, the horizontal position of the component feeding location may be acquired during the suction operation, and the suction position in the horizontal direction may be corrected and suctioned based on the acquired position.

While the example in which the components held by the tape are fed to the component feeding location has been shown in the aforementioned embodiment, the present disclosure is not restricted to this. According to the present disclosure, components placed on a tray or the like may be supplied to the component feeding location.

While the processing performed by the controller is described, using the flow described in a manner driven by a flow in which processing is performed in order along a processing flow for the convenience of illustration in the aforementioned embodiment, the present disclosure is not restricted to this. According to the present disclosure, the processing performed by the controller may be performed in an event-driven manner in which processing is performed on an event basis. In this case, the processing may be performed in a complete event-driven manner or in a combination of an event-driven manner and a manner driven by a flow.

What is claimed is:

1. A component mounting device comprising:
   a head unit including a mounting head configured to mount a component on a substrate;
   a component feeder configured to feed the component to the mounting head;
   an imager provided on the head unit and configured to image a component feeding location of the component feeder from a plurality of directions above the component feeding location; and
   a controller configured to acquire a horizontal position and a vertical height position of the component at the component feeding location based on images of the component feeding location captured from the plurality of directions above the component feeding location by the imager, wherein the controller is configured to obtain a shifted horizontal distance of the component at a real vertical height position with respect to a horizontal position when the component exists on a reference surface based on the vertical height position of the component at the component feeding location, and to correct the horizontal position of the component based on the shifted horizontal distance.

2. The component mounting device according to claim 1, wherein the controller is configured to correct the horizontal position of the component based on the vertical height position of the component at the component feeding location.

3. The component mounting device according to claim 1, wherein the controller is configured to acquire a height around the component feeding location based on the images of the component feeding location captured from the plurality of directions above the component feeding location by the imager, and to determine a presence or absence of a component to be suctioned at the component feeding location.

4. The component mounting device according to claim 3, wherein the controller is configured to control feeding a new component to the component feeding location when the component to be suctioned is absent at the component feeding location, and to control the mounting head to suction the component again.

5. The component mounting device according to claim 1, wherein the controller is configured to acquire the vertical height position of the component at the component feeding location during an operation of suctioning the component by the mounting head based on the images of the component feeding location captured from the plurality of directions by the imager above the component feeding location, and to perform control of correcting a suction height position in a vertical direction and suctioning the component.

6. The component mounting device according to claim 1, wherein the controller is configured to control the imager to image the component feeding location from the plurality of directions above the component feeding location when the mounting head is lowered to the component feeding location.

7. The component mounting device according to claim 1, wherein the imager is configured to image the component feeding location from a plurality of oblique directions with respect to a vertical direction.

8. The component mounting device according to claim 1, wherein the imager includes a plurality of cameras, or a single camera and an optical system configured to divide a field of view of the single camera.

9. The component mounting device according to claim 2, wherein the controller is configured to acquire a height around the component feeding location based on the images of the component feeding location captured from the plurality of directions above the component feeding location by the imager, and to determine a presence or absence of a component to be suctioned at the component feeding location.

10. The component mounting device according to claim 2, wherein the controller is configured to acquire the vertical height position of the component at the component feeding location during an operation of suctioning the component by the mounting head based on the images of the component feeding location captured from the plurality of directions above the component feeding location by the imager, and to perform control of correcting a suction height position in a vertical direction and suctioning the component.

11. The component mounting device according to claim 3, wherein the controller is configured to acquire the vertical height position of the component at the component feeding location during an operation of suctioning the component by the mounting head based on the images of the component feeding location captured from the plurality of directions above the component feeding location by the imager, and to perform control of correcting a suction height position in a vertical direction and suctioning the component.

12. The component mounting device according to claim 4, wherein the controller is configured to acquire the vertical height position of the component at the component feeding location during an operation of suctioning the component by the mounting head based on the images of the component feeding location captured from the plurality of directions above the component feeding location by the imager, and to perform control of correcting a suction height position in a vertical direction and suctioning the component.

13. The component mounting device according to claim 2, wherein the controller is configured to control the imager to image the component feeding location from the plurality of directions above the component feeding location when the mounting head is lowered to the component feeding location.

14. The component mounting device according to claim 3, wherein the controller is configured to control the imager to image the component feeding location from the plurality of directions above the component feeding location when the mounting head is lowered to the component feeding location.

15. The component mounting device according to claim 4, wherein the controller is configured to control the imager to image the component feeding location from the plurality of directions above the component feeding location when the mounting head is lowered to the component feeding location.

16. The component mounting device according to claim 5, wherein the controller is configured to control the imager to image the component feeding location from the plurality of directions above the component feeding location when the mounting head is lowered to the component feeding location.

17. The component mounting device according to claim 2, wherein the imager is configured to image the component feeding location from a plurality of oblique directions with respect to a vertical direction.

18. The component mounting device according to claim 3, wherein the imager is configured to image the component feeding location from a plurality of oblique directions with respect to a vertical direction.

19. The component mounting device according to claim 2, wherein the imager includes a plurality of cameras, or a single camera and an optical system configured to divide a field of view of the single camera.

20. The component mounting device according to claim 3, wherein the imager includes a plurality of cameras, or a single camera and an optical system configured to divide a field of view of the single camera.

* * * * *